United States Patent [19]

Walley

[11] Patent Number: 5,764,689

[45] Date of Patent: Jun. 9, 1998

[54] VARIABLE DIGITAL AUTOMATIC GAIN CONTROL IN A CORDLESS DIRECT SEQUENCE SPREAD SPECTRUM TELEPHONE

[75] Inventor: John S. Walley, Lake Forest, Calif.

[73] Assignee: Rockwell International Corporation, Newport Beach, Calif.

[21] Appl. No.: 568,161

[22] Filed: Dec. 6, 1995

[51] Int. Cl.$^6$ .................. H04K 1/00; H04L 27/08
[52] U.S. Cl. .......................... 375/206; 375/345
[58] Field of Search ........................ 375/345, 200, 375/206, 208; 455/246.1, 234.1; 327/50; 328/68; 330/278, 279

[56] References Cited

U.S. PATENT DOCUMENTS

| | | | |
|---|---|---|---|
| 3,931,584 | 1/1976 | Motley et al. | 375/345 |
| 4,479,255 | 10/1984 | Geesen et al. | 455/246.1 |
| 4,481,640 | 11/1984 | Chow et al. | 375/1 |
| 4,724,435 | 2/1988 | Moses et al. | 340/870 |
| 4,804,938 | 2/1989 | Rouse et al. | 340/310 |
| 4,864,244 | 9/1989 | Sasaki | 375/345 |
| 5,042,050 | 8/1991 | Owen | 375/1 |
| 5,077,753 | 12/1991 | Grau, Jr. et al. | 375/1 |
| 5,103,459 | 4/1992 | Gilhousen et al. | 375/1 |
| 5,150,377 | 9/1992 | Vannucci | 375/1 |
| 5,267,272 | 11/1993 | Cai et al. | 375/345 |
| 5,280,472 | 1/1994 | Gilhousen | 370/18 |
| 5,309,474 | 5/1994 | Gilhousen et al. | 375/1 |
| 5,351,270 | 9/1994 | Graham et al. | 375/1 |
| 5,375,140 | 12/1994 | Bustamante et al. | 375/1 |
| 5,416,797 | 5/1995 | Gilhousen et al. | 375/705 |
| 5,550,869 | 8/1996 | Gurantz et al. | 375/345 |
| 5,563,916 | 10/1996 | Scarpa | 375/345 |
| 5,566,214 | 10/1996 | Kroeger et al. | 375/345 |
| 5,596,605 | 1/1997 | Kinyanagi et al. | 375/345 |

*Primary Examiner*—Tesfaldet Bocure
*Attorney, Agent, or Firm*—James P. O'Shaughnessy; William C. Cray

[57] ABSTRACT

A cordless telephone system connectable to the public switched telephone network having a base station and one or more handsets communicating with the base station by an RF link utility time division duplex direct sequence spread spectrum modulation technique, having a digital variable rate automatic gain control loop. The gain is varied by changing the scale factor for the discriminator output. A high gain scale factor is used during signal acquisition. When the signal has been acquired, a low scale factor is utilized during signal tracking. The controller in the base station and in the handset causes gain use of the different scale factor at the appropriate time.

24 Claims, 5 Drawing Sheets

VARIABLE DIGITAL AUTOMATIC GAIN CONTROL IN A CORDLESS DIRECT SEQUENCE SPREAD SPECTRUM TELEPHONE

BACKGROUND OF THE INVENTION

1. Field of the Invention

The present invention relates generally to improvements in digital telephones and, more particularly, pertains to new and improved digital automatic gain control circuits for cordless direct sequence spread spectrum telephones.

2. Description of Related Art

The cordless telephone products that exist today for the most part use analog frequency modulation in the 46–49 MHz band, and provide good speech quality when the handset is at close proximity to the base station. Although these analog cordless telephones are inexpensive and offer advantages to the customer which have made the products a successful replacement for corded telephones, these analog phones still leave much room for improvement. For example, it would be desirable to have a longer handset-to-base station range without dropouts, more channels, greater security, and better multihandset telephone systems.

Use of digital modulation and digital coding techniques offers more robust voice communication over a radio channel, although requiring greater channel bandwidth. Digital modulation also has a capture effect that greatly surpasses co-channel and adjacent channel interference, thereby providing a more noise-free conversation. Use of digital modulation encoding also allows for the addition of effective scrambling codes to thereby greatly improve telephone security. In addition, by utilizing the industrial, medical, and scientific (ISM) band for radio transmission and reception (902–920 MHz), increased power levels above those in the 46–49-MHz band are permitted, thus increasing the operating range. The only requirement of the ISM band is that direct sequence spread spectrum (DSSS) modulation be utilized.

The use of direct sequence spread spectrum modulation causes bandwidth spreading which is large compared to the bandwidth required by the information signal. As a result, synchronization of a receiver to a specified modulation scheme constitutes a major problem in the design and operation of spread spectrum communication systems. That problem is exacerbated in systems where more than one handset is communicating with a certain base station and when time division duplex is used because of the rapid acquisition that is required. In other words, the time to acquire the signal in time division duplex direct sequence spread spectrum systems becomes critically short, especially in multihandset systems where acquisition time cannot be extended. This is a serious problem because during the acquisition process a search through the region of time, frequency, and amplitude uncertainty is conducted in order to determine that the locally-generated code and the incoming code are sufficiently aligned. In the system of the present invention a two-millisecond-wide time slot is used for transmit and a two-millisecond-wide time slot is used for receive. In this system amplitude acquisition (AGC) is done first and then timing acquisition. The next step after acquisition is tracking. Tracking is required to ensure that close alignment is maintained throughout the communication.

Because of the requirement for very fast acquisition, the normal design approach of designing the AGC function for accurate, i.e. slow tracking and then using the tracking parameters for the acquisition cycle is simply not satisfactory. To solve this problem, a variable automatic gain control had to be devised wherein a first gain was provided for rapid acquisition, and then a second gain was used during tracking to reduce AGC loop bandwidth and, therefore, improve performance.

SUMMARY OF THE INVENTION

To accomplish rapid signal acquisition and stable tracking of the signal once acquired, in a time division duplex direct sequence spread spectrum communication link, the digital automatic gain control loop utilizes several gain constants. A high gain constant is used during the short acquisition cycle. A lower gain constant is used during tracking of the signal after acquisition. The gain constant is changed by the system controller at the appropriate time.

BRIEF DESCRIPTION OF THE DRAWINGS

The exact nature of this invention, as well as the objects and advantages, will become readily apparent from consideration of the following specification as illustrated in the accompanying drawings, in which like reference numerals designate like parts throughout the figures thereof, and wherein.

DETAILED DESCRIPTION OF THE PREFERRED EMBODIMENTS

The following description is provided to enable any person skilled in the art to make and use the invention and sets forth the best modes contemplated by the inventor of carrying out his invention. Various modifications, however, will remain readily apparent to those skilled in the art, since the generic principles of the present invention have been defined herein specifically to provide a variable digital automatic gain control.

Figure 1:
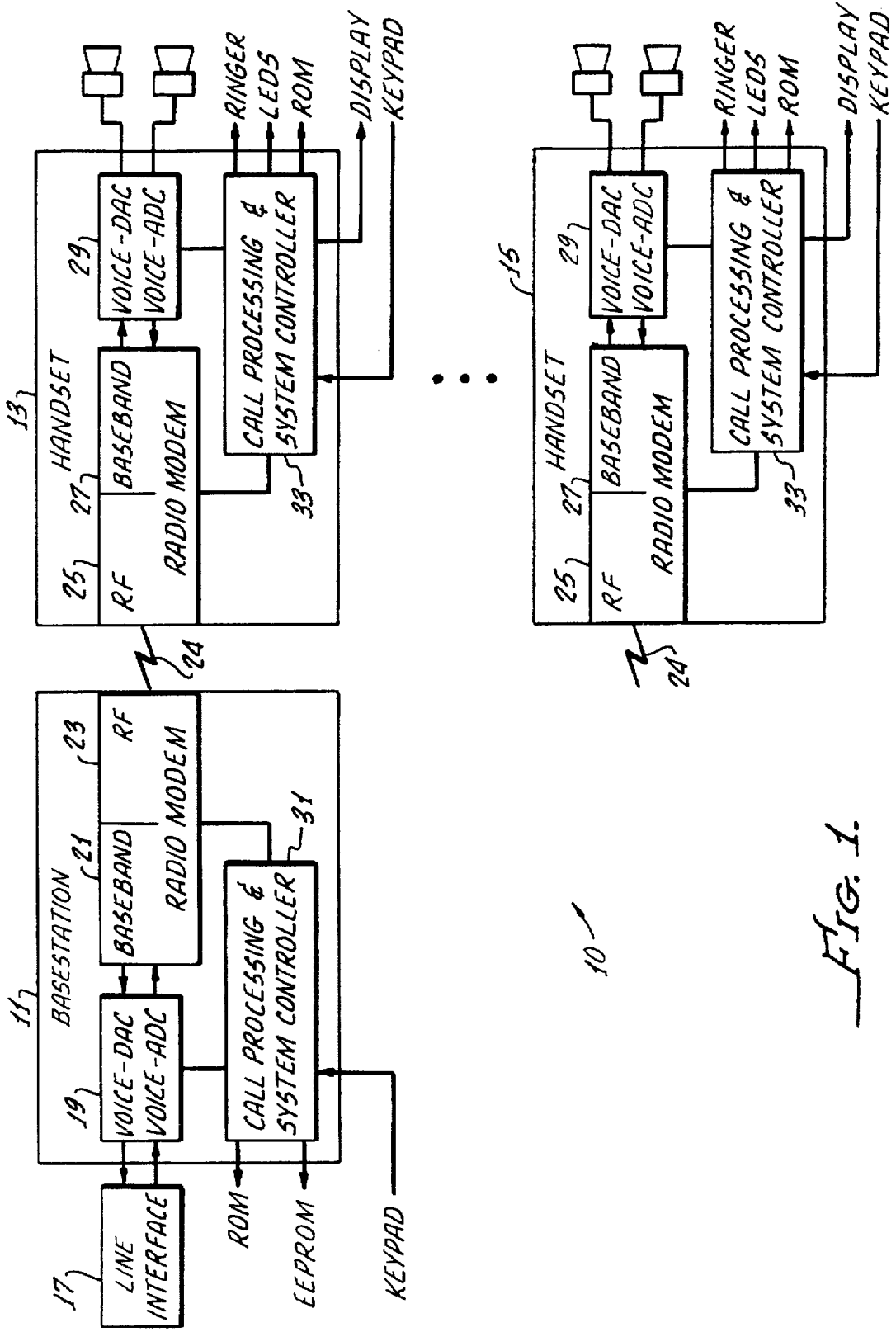
FIG. 1 is a block diagram of a time division duplex direct sequence spread spectrum telephone having more than one handset, and one base station which is connected to the public switched telephone network.

Referring to FIG. 1, the digital cordless telephone 10 having a plurality of handsets 13, 15 is designed to provide full duplex voice communication between handsets 13, 15 and the public switched telephone network (PSTN) (not shown) by way of an RF channel 24 through a base station 11 which is connected to the public switched telephone network by a line interface circuit 17.

Both the base station 11 and each of the handsets 13, 15 utilize a radio modem which is composed of a baseband modem 21, 27 in the base station 11 and both handsets 13, 15, respectively, and a radiofrequency modem 23, 25 in the base station 11 and both handsets 13, 15, respectively. The radio modem transfers digital voice and control data between the handsets 13, 15 and the base station 11. Voice-to-digital and digital-to-voice converters 19 in the base station 11 and the handsets 13, 15 provide voice transport over the radio modem between the speaker and microphone and the handsets and the public switched telephone network. Each of the handsets 13, 15 and the base station 11 also has a system controller 33 for call processing and control functions. The system control unit 31 in the base station 11 and the controller 33 in the handsets 13, 15 function to provide the protocol for the radio modem in the base station and handsets to allow link establishment, maintenance, and power management. Telephone controls such as dial tones, ringing, keypad, and other call processing functions are also supported, as well as subsidiary functions such as displays, out-of-range alert, low battery alert, and signal quality alert.

The radio transmission and reception frequency band of the radio modem is in the lower ISM band (902–928 MHz). Operation in this band is governed by FCC Par. No. 15.247 requirements and other Part 15 regulations.

Figure 2:
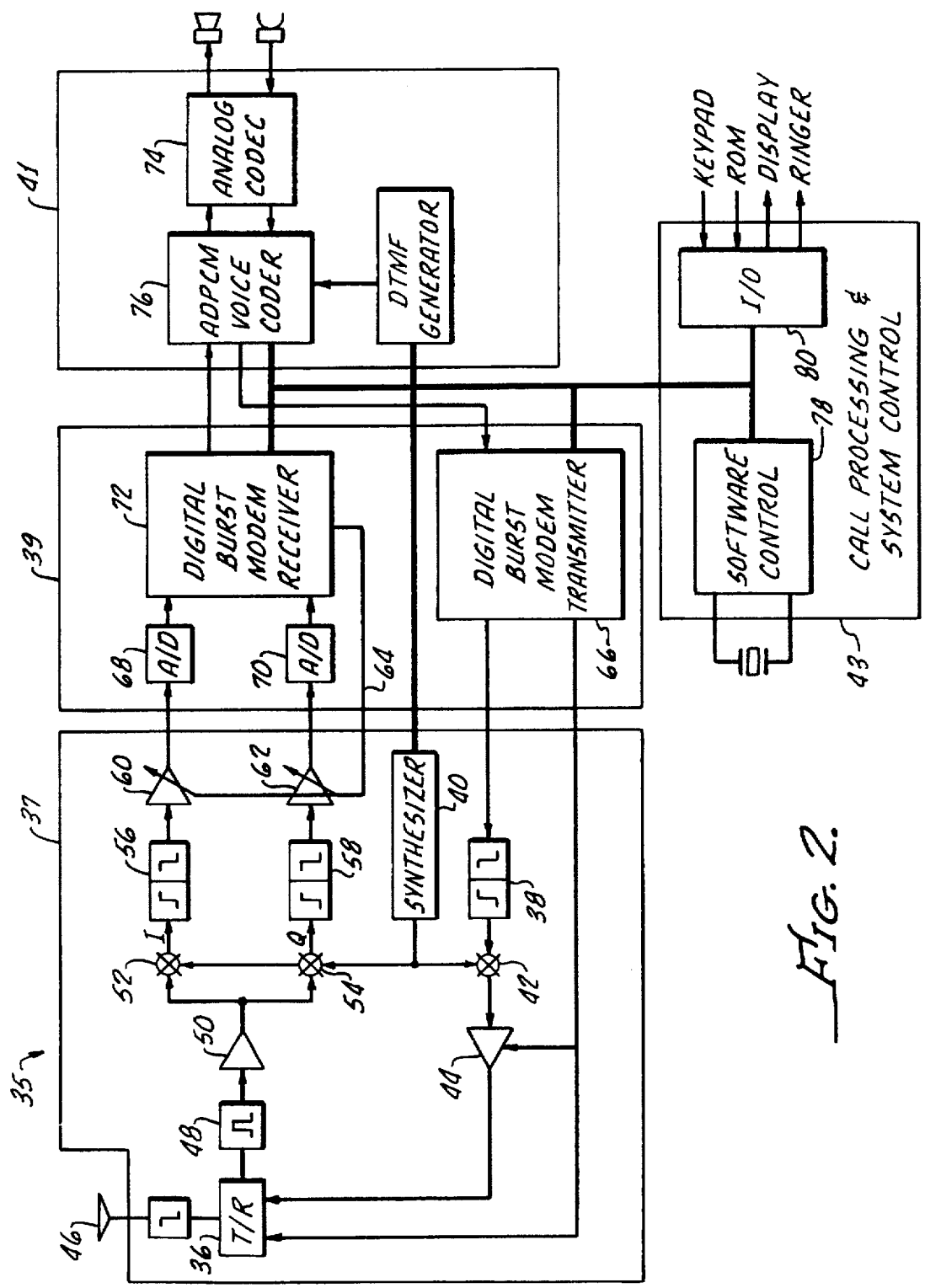
FIG. 2 is a block diagram of the modem configuration and controller found in both the handset and base station of the system of FIG. 1.

Referring now to FIG. 2, the modular construction of the base station and each handset is illustrated by the functional block diagram 35 which basically shows four functional blocks, an RF modem 37, a baseband modem 49, an audio modem 41, and a call processing and system controller 43. Each of these four functional blocks is substantially identical for each handset and each base station. The radio modem in the baseband and handsets shown in FIG. 1 are partitioned into an RF modem 37 and a baseband modem 39.

The RF modem 37 is a direct conversion transceiver. For transmit, analog, wave-shaped baseband data is modulated directly to the carrier frequency. For receive, the carrier is directly converted to analog, baseband, in-phase, and quadrature data signals. Because time division duplexing is utilized to channelize the transmit and receive data, TR switch 36 is used rather than a duplexer.

During the transmit phase, the RF modem 37 takes baseband data, high-pass filters it to remove any DC and then low-pass filters it to provide spectral shaping in filter unit 38. After filtering, the resultant signal modulates the synthesized RF carrier coming out of synthesizer 40 in modulator 42. The modulated signal is then amplified to one of the two or more transmit power levels by amplifier unit 44. The signal is then routed through TR switch 36 for transmission by antenna 46.

During reception, TR switch 36 selects the receive path from antenna 46. The received signal is filtered by a band-pass filter 48 to reject out-of-band signals. The filter signal is amplified by a low noise amplifier 50 and then enters a pair of mixers 52, 54, which convert the received signal to in-phase and quadrature baseband signals. Each baseband signal is high-pass and low-pass filtered, the in-phase signal in filter unit 56 and the quadrature phase signals in filter unit 58. The resultant in-phase and quadrature filtered signals are amplified in amplifiers 60, 62, respectively, by a programmable gain received from the baseband modem 49 over line 64 to bring the signals to the proper voltage levels.

The baseband modem 39 performs all the spread spectrum modulation and demodulation, data timing recovery, automatic frequency control estimation and correction, and AGC estimation, framing, and rate adaptation. During transmit, the baseband transmitter assembles a voice and supervisory data B frame and a link acquisition A frame. These frames are generated by an appropriate state machine under microprocessor control in digital burst modem transmitter 66. The data bits of the selected frames are differentially encoded and modulated with a spreading code in burst modem transmitter 66. After modulation, the nonreturn to zero (NRZ) signal is sent to the RF modem 37 for transmission.

During receive, the baseband modem 39 performs A/D conversion on the in-phase and quadrature baseband signals from the RF modem by A/D converters 68, 70, respectively. The A/D converted digital outputs are phase rotated and data demodulated in digital burst modem receiver 72.

The audio modem 41 comprises a CODEC 74 and audio engine 76. The CODEC 74 converts between a continuous amplitude, continuous time audio waveform, and an 8000 sample-per-second 13-bit digital representation. The audio engine or voice coder 76 implements a CCITT G721 ADPCM voice compression algorithm which converts between 32 kbps digital RF modem channel data and 8 kbps 13-bit linear voice.

The call processing and system controller 53 consists of a 6502 microcontroller 78 with an I/O 80, which supports all the system and call processing functions.

Figure 3:
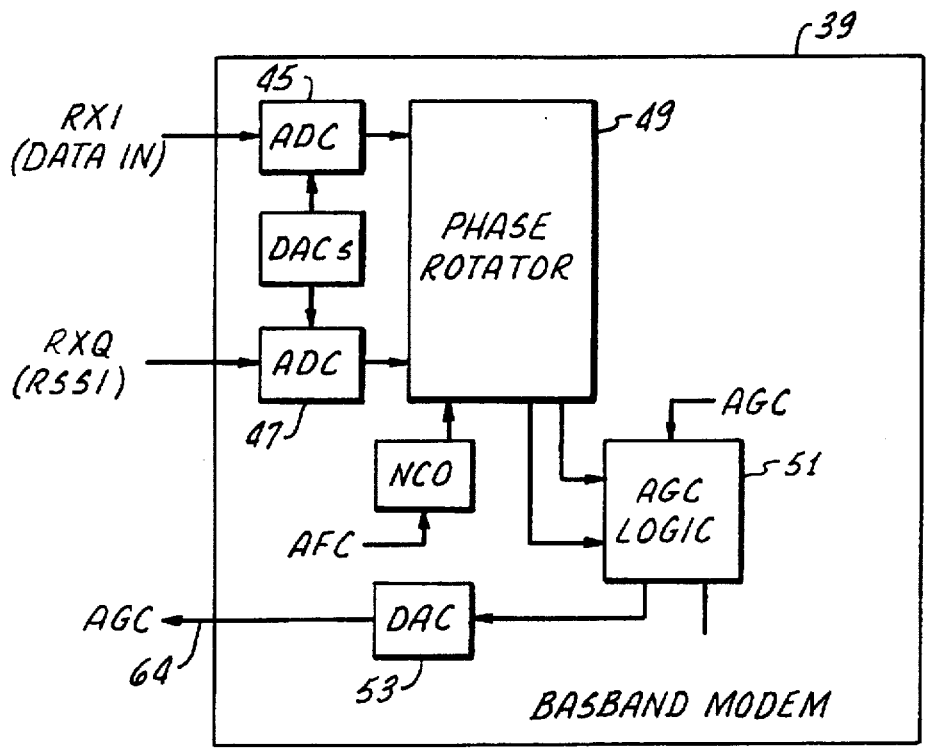
FIG. 3 is a block diagram of part of the baseband modem shown in FIG. 2.

Referring now to FIG. 3, which shows the receiver portion of the baseband modem 39 in greater detail, the receiver performs three-bit A/D conversion on the in-phase and quadrature baseband signals from the RF modem A/D converter 45 receiving the in-phase baseband signals from the RF modem. A/D converter 47 receives the quadrature baseband signals from the RF modem. The A/D converted digital outputs are phase rotated in phase rotator 49 to remove frequency offsets and are sent for timing recovery and data demodulation (not shown).

The in-phase and quadrature baseband signals which have been converted by A/D converters 45, 47 are provided to automatic gain control logic 51, which determines the gain based on factors to be explained hereinafter, and supplies a gain control signal to digital-to-analog converter 53, the output of which is sent to the RF modem over line 64 to be used as the automatic gain control signal.

Figure 4:
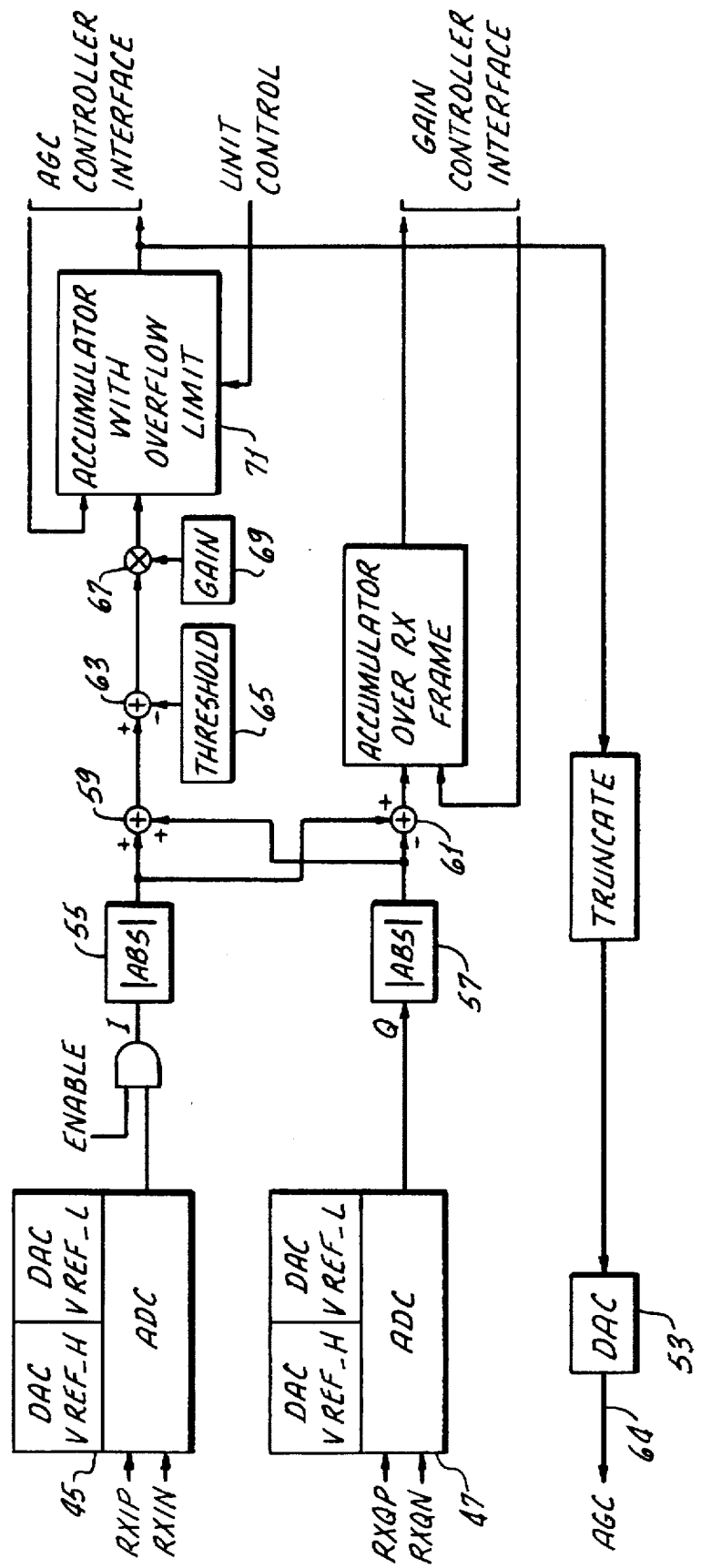
FIG. 4 is a block diagram of the automatic gain control logic circuitry used in FIG. 3.

Referring now to FIG. 4, which illustrates the basic functions of the AGC logic 51 of FIG. 3, it can be seen that the in-phase and quadrature phase baseband signals from the RF modem are supplied to the A/D converters 45, 47, respectively. Thereafter, the outputs are taken by the logic circuit and detected in operational units 55, 59 for the in-phase signal and 57, 61 for the quadrature phase signals, to obtain the energy approximation |I|+|Q| which is the discriminator signal. The value of the discriminator signal is subtracted from a programmable reference stored in threshold register 65, then multiplied by a loop gain constant stored in gain register 69 by operators 63 and 67, respectively. The output of multiplier 67 is supplied to an accumulator 71, where it is integrated. The most significant bits of the accumulator 71 are provided to digital-to-analog converter 53 and then sent to the RF modem for gain control.

Figure 5:
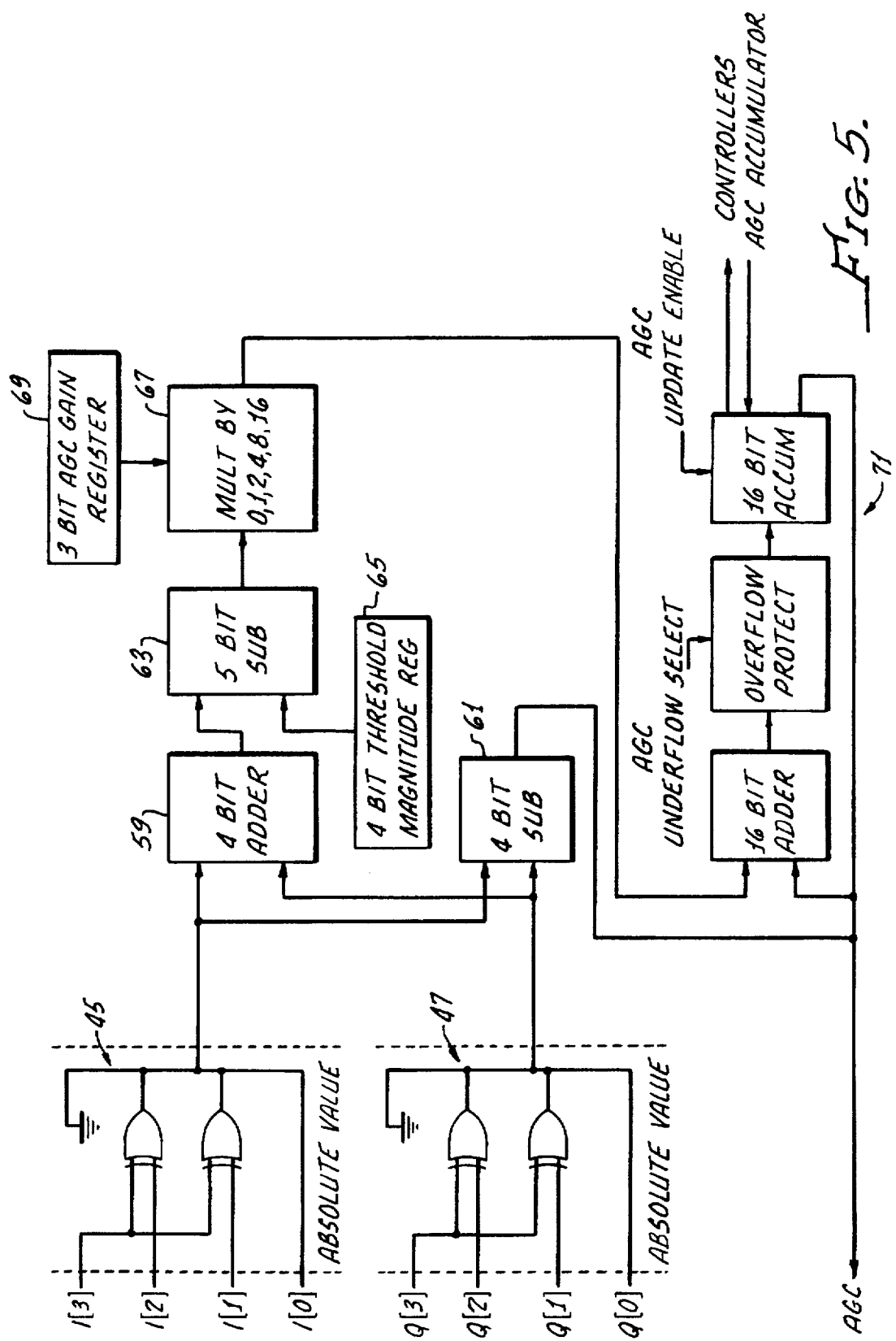
FIG. 5 is a block logic diagram of the preferred embodiment of the automatic gain control circuit of the present invention.

FIG. 5 shows the logic implementation of AGC logic 51. The absolute value circuits 45, 47 for the in-phase and quadrature phase digital signals are shown as a network of exclusive-OR gates, the outputs of which are supplied to a four-bit adder 59 to come up with the |I|+|Q| discriminator signal. This signal is supplied to a five-bit subtractor 63, which subtracts the discriminator signal from a four-bit threshold in magnitude register 65. The result is supplied to a multiplier 67, which is controlled by a three-bit gain constant in gain register 69, the output of which is sent to the accumulator 71 comprised of a 16-bit adder, with overflow protection and a 16-bit accumulator which, in turn, provides an AGC signal to the digital-to-analog converter.

The AGC signal is varied according to whether the RF and baseband modems are in the receive acquisition or receive tracking mode. In the receive acquisition mode, the AGC signal is adjusted to produce as high a gain as possible without producing AGC instability. This provides fast acquisition. During tracking, the AGC signal is adjusted to provide for stable tracking.

Figure 6:
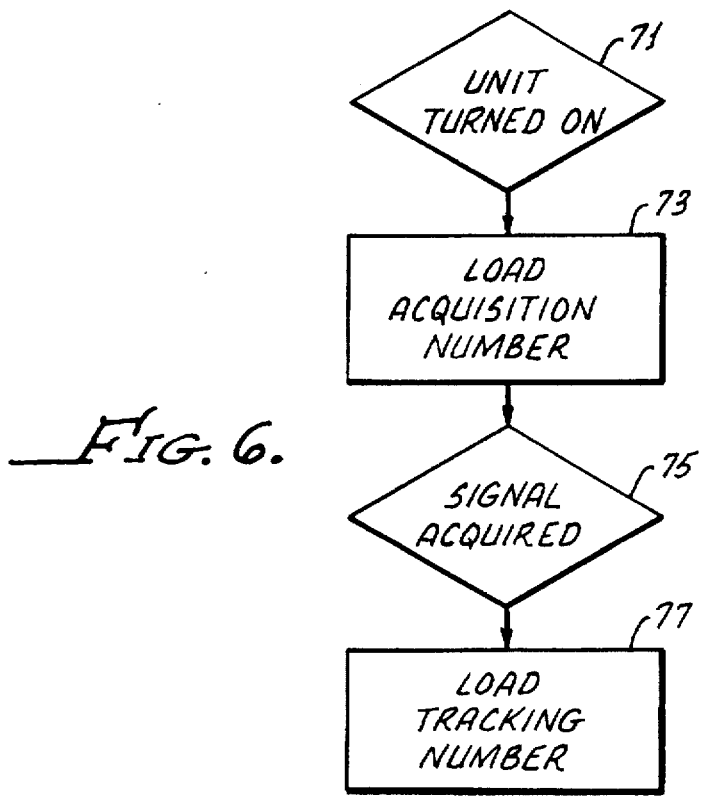
FIG. 6 is a flowchart of the controller sequence with respect to the operation of the automatic gain control logic of FIG. 5.

This variation of the AGC signal is accomplished by the gain factor that is read into the three-bit AGC gain register 69 by the control unit 78 (FIG. 2) according to the procedure shown in FIG. 6. The system controller 43 (FIG. 2) is aware of when the handset or base station are turned on. Knowing when the unit is turned on at 71 (FIG. 6) causes the software controller 78 to load the acquisition factor 73 into three-bit AGC gain register 69, causing very high digital loop gain to be generated. Once the signal is acquired, the system controller 43 is appropriately advised and loads the tracking gain control factor into three-bit AGC gain register 69 at 77 (FIG. 6). If the signal for some reason is lost, system control unit 43, by way of controller 78, will again load the acquisition gain factor into three-bit AGC gain register 69 and proceed through steps 73, 75, and 77 again.

Those skilled in the art will appreciate that various adaptations and modifications of the just-described preferred embodiment can be configured without departing from the scope and spirit of the invention. Therefore, it is to be understood that, within the scope of the appended claims, the invention may be practiced other than as specifically described herein.

What is claimed is:

1. In a direct sequence spread spectrum communication link, a digital automatic gain control circuit connected to receive in-phase and quadrature baseband signals that have been converted to digital format, the digital automatic gain control circuit comprising: means for generating a discrimination signal from the received in-phase and quadrature baseband digital signals; and means for multiplying the generated discriminator signal by a first gain constant during signal acquisition and a second different gain constant during signal tracking.

2. The digital automatic gain control circuit of claim 1 further comprising an accumulator to generate a digital automatic gain control value.

3. The digital automatic gain control circuit of claim 2 further comprising a digital-to-analog converter for receiving the most significant bits of the automatic gain control value from said accumulator and converting them to analog form for use as a gain control signal.

4. The digital automatic gain control circuit of claim 1 wherein said generating means generates a discriminator signal by summing the absolute values of the received in-phase and quadrature baseband digital signals.

5. The digital automatic gain control circuit of claim 4 further comprising an accumulator to generate a digital automatic gain control value.

6. The digital automatic gain control circuit of claim 5 further comprising a digital-to-analog converter for receiving the most significant bits of the automatic gain control value from said accumulator and converting them to analog form for use as a gain control signal.

7. The digital automatic gain control circuit of claim 4 wherein said multiplying means multiplies the generated discriminator signal by a high gain constant during signal acquisition, and then multiplies the generated discriminator signal by a low gain constant after signal acquisition and during signal tracking.

8. The digital automatic gain control circuit of claim 7 further comprising an accumulator to generate a digital automatic gain control value.

9. The digital automatic gain control circuit of claim 8 further comprising a digital-to-analog converter for receiving the most significant bits of the automatic gain control value from said accumulator and converting them to analog form for use as a gain control signal.

10. In a direct sequence spread spectrum communication link, a digital automatic gain control circuit connected to receive in-phase and quadrature baseband signals that have been converted to digital format the digital automatic control circuit comprising: means for generating a discriminator signal from the received in-phase and quadrature baseband digital signals: and means for multiplying the generated discriminator by a high gain constant during signal acquisition, and by a low gain constant after signal acquisition and during signal tracking.

11. The digital automatic gain control circuit of claim 10 further comprising an accumulator to generate a digital automatic gain control value.

12. The digital automatic gain control circuit of claim 11 further comprising a digital-to-analog converter for receiving the most significant bits of the automatic gain control value from said accumulator and converting them to analog form for use as a gain control signal.

13. In a cordless telephone having a base station connectable to a switched telephone network and at least one handset, said base station and handset communicating over a radio frequency link utilizing time division duplex direct sequence spread spectrum modulation, a digital automatic gain control circuit, in said handset and in said base station, each connected to receive the digital in-phase and quadrature baseband signals received over the radiofrequency link, the digital automatic gain control circuit comprising: means for generating a discriminator signal from the in-phase and quadrature baseband digital signals; and means for scaling the discriminator signal by a first gain constant during acquisition and a second different gain constant during tracking.

14. The digital automatic gain control circuit of claim 13 further comprising an accumulator to generate a digital automatic gain control value.

15. The digital automatic gain control circuit of claim 13 further comprising a digital-to-analog converter for receiving the most significant bits of the automatic gain control value from said accumulator and converting them to analog form for use as a gain control signal.

16. The digital automatic gain control circuit of claim 13 wherein said scaling means increases the discriminator signal, thereby increasing the gain during signal acquisition, and decreases the discriminator signal, thereby decreasing the gain during signal tracking.

17. The digital automatic gain control circuit of claim 16 further comprising an accumulator to generate a digital automatic gain control value.

18. The digital automatic gain control circuit of claim 17 further comprising a digital-to-analog converter for receiving the most significant bits of the automatic gain control value from said accumulator and converting them to analog form for use as a gain control signal.

19. The digital automatic gain control circuit of claim 13 wherein said generating means generates a discriminator signal by summing the absolute values of the receiver in-phase and quadrature baseband digital signals.

20. The digital automatic gain control circuit of claim 19 further comprising an accumulator to generate a digital automatic gain control value.

21. The digital automatic gain control circuit of claim 20 further comprising a digital-to-analog converter for receiving the most significant bits of the automatic gain control value from said accumulator and converting them to analog form for use as a gain control signal.

22. The digital automatic gain control circuit of claim 19 wherein said scaling means increases the discriminator signal, thereby increasing the gain during signal acquisition, and decreases the discriminator signal, thereby decreasing the gain during signal tracking.

23. The digital automatic gain control circuit of claim 22 further comprising an accumulator to generate a digital automatic gain control value.

24. The digital automatic gain control circuit of claim 23 further comprising a digital-to-analog converter for receiving the most significant bits of the automatic gain control value from said accumulator and converting them to analog form for use as a gain control signal.

* * * * *